United States Patent [19]
Murai

[11] Patent Number: 5,250,832
[45] Date of Patent: Oct. 5, 1993

[54] MOS TYPE SEMICONDUCTOR MEMORY DEVICE

[75] Inventor: Ichiro Murai, Tokyo, Japan

[73] Assignee: Nippon Steel Corporation, Tokyo, Japan

[21] Appl. No.: 770,873

[22] Filed: Oct. 4, 1991

[30] Foreign Application Priority Data

Oct. 5, 1990 [JP] Japan ................. 2-267747

[51] Int. Cl.$^5$ ................. H01L 29/68; H01L 29/167
[52] U.S. Cl. ................. 257/306; 257/335; 257/412; 257/607
[58] Field of Search ................. 357/23.6, 23.4, 59, 357/63; 257/306, 335, 412, 607

[56] References Cited

U.S. PATENT DOCUMENTS

| | | | |
|---|---|---|---|
| 5,017,982 | 5/1991 | Kobayashi | 357/23.6 |
| 5,027,185 | 6/1991 | Liauh | 357/59 |

FOREIGN PATENT DOCUMENTS

| | | |
|---|---|---|
| 63-99573 | 4/1988 | Japan . |
| 1-119054 | 5/1989 | Japan . |
| 2-117176 | 5/1990 | Japan . |

*Primary Examiner*—Mark V. Prenty
*Attorney, Agent, or Firm*—Pollock, Vande Sande & Priddy

[57] ABSTRACT

A MOS type semiconductor memory device comprises a silicon (Si) substrate of a first conductivity type and a memory cell on a main surface of the Si substrate including a MOS transistor with a first and a second diffused layer highly doped with opposite second conductivity type impurities which provide a source and a drain region spaced apart in the main surface, a gate electrode of a conductive material formed through an insulating layer between the two highly doped diffused layers; an inter-layer insulating film formed to cover the MOS transistor; a capacitor cell formed on the inter-layer film including a lower electrode layer of conductive material formed on the inter-layer insulating film, a portion of which extends through a contact hole formed in the inter-layer insulating layer to penetrate through this layer to reach the junction adjacent to one of the highly doped diffused layers, a dielectric film on the lower electrode layer, and an upper electrode layer formed on the insulating film; and a double-diffused layer doped with the second conductivity type impurities formed to overlap with one of the two highly doped diffused layers at the junction of the Si substrate to make an electric contact between the source-drain circuit of the MOS transistor and the lower electrode.

11 Claims, 4 Drawing Sheets

MOS TYPE SEMICONDUCTOR MEMORY DEVICE

BACKGROUND OF THE INVENTION

1. Field of the Invention

The present invention relates to a MOS type semiconductor memory device, and more particularly to a MOS type semiconductor device having a MOS transistor and a capacitor cell which constitute a dynamic RAM.

2. Description of the Related Art

It is known to provide a MOS type semiconductor memory device having a MOS transistor and a stacked capacitor cell which constitute a dynamic RAM.

For example, JP-A-1-119054 (1989) discloses a MOS type semiconductor memory device in which a Si (silicon) substrate is formed with plural isolated-regions, and a memory cell including a MOS transistor and a stacked capacitor cell is formed in each of the regions.

In fabricating a MOS type semiconductor memory device, a gate electrode is formed with an intermediate gate insulating film on a main surface of a Si substrate of, for example, p-conductivity type at each isolated region. Then, N type impurities such as arsenic (As) are highly ion-implanted in predetermined regions of the Si substrate by using the gate electrode as a mask. The impurities are diffused and activated by heat treatment thereby forming source and drain of the MOS transistor.

Next, an inter-layer insulating film is formed on the entire surface so as to cover the gate electrode and the gate insulating film. Predetermined portions of the inter-layer insulating film and the gate insulating film are etched away to form a contact hole. A polycrystalline Si film doped with N type impurities such as arsenic (As) and phosphorus (P) is formed so as to cover the contact hole and the inter-layer insulating film thereby forming a conductive layer serving as a lower electrode (charge storage layer) of the stacked capacitor cell. In this case, the drain region is made sufficiently large so that it is exposed to the contact hole. Otherwise, in doping the poly Si film with the N type impurities, the highly doped diffused layer is formed immediately below the contact hole by diffusion of the N type impurities in the Si substrate so as to overlap with the drain region. Thus, an electric contact is made between the drain region and the lower electrode layer. Thereafter, a dielectric film and another conductive layer of a poly Si film doped with the N type impurities such as As or P which serves as an upper electrode of the stacked capacitor cell are formed successively on the lower electrode, thereby forming a stacked capacitor cell. The stacked capacitor cell and the MOS transistor constitute a MOS type semiconductor memory cell.

The MOS type semiconductor memory device thus formed has a tendency that an electric field concentrates on the junction between the highly doped diffused layer and the Si substrate or a P-N junction to increase a leak current therebetween. As a result, the conventional MOS type semiconductor memory device involves a problem that the data is not held in the memory cell for a sufficiently long time so that it is difficult to discriminate a charged state from a discharged state when the data is read out, resulting in a reading error.

SUMMARY OF THE INVENTION

An object of the present invention is to provide a MOS type semiconductor memory device which comprises a memory cell capable of holding data for a long time thereby to reduce error occurrence in reading the data.

Another object of the present invention is to provide a semiconductor device which reduces concentration of the electric field at the junction between the impurity doped layer formed immediately below a contact hole and a semiconductor substrate and the P-N junction.

According to the present invention, a MOS type semiconductor memory device comprises a silicon (Si) substrate of a first conductivity type; and a memory cell formed on a main surface of the Si substrate, wherein the memory cell comprises a MOS transistor including first and second high concentration diffused layers highly doped with impurities of a second conductivity type different from the first conductivity type and formed in predetermined regions apart from each other in the main surface of the Si substrate so as to provide source and drain of the MOS transistor, and a gate electrode of a conductive material formed on a channel between the first and second high concentration diffused layers with an insulating layer of an insulating material interposed therebetween; an inter-layer insulating film of an insulating material formed so as to cover the MOS transistor; a capacitor cell formed on the inter-layer insulating film and including a lower electrode layer of a conductive material formed on the inter-layer insulating film and having a portion extending through a contact hole formed in the inter-layer insulating film to a junction portion in the Si substrate adjacent to one of the first and second high-concentration diffused layers, a dielectric film formed on the lower electrode layer and an upper electrode layer formed on the dielectric film; and a double diffused layer doped with impurities of the second conductivity type and formed so as to overlap with one of the first and second high-concentration diffused layers at the junction in the Si substrate so that an electric contact is made between a source-drain circuit of the MOS transistor and the lower electrode.

In one embodiment, the double diffused layer is composed of a high concentration diffused layer highly doped with impurities of the second conductivity type to a shallow depth and a low-concentration diffused layer lightly doped with impurities of the same conductivity type to a deep depth.

In the MOS type semiconductor memory device according to the present invention, the lower electrode of the capacitor and the source-drain circuit of the MOS transistor are electrically connected with each other through the double diffused layer, and the lower electrode of the capacitor is joined with the Si substrate through the low-concentration diffused layer of the double diffused layer so that the concentration of the electric field at the junction is reduced. Therefore, the leak current flowing from the lower electrode to the Si substrate is reduced so that the data is held in the memory cell for a sufficiently long time, thus preventing error in reading out the data.

DESCRIPTION OF THE PREFERRED EMBODIMENTS

Figure 1A:
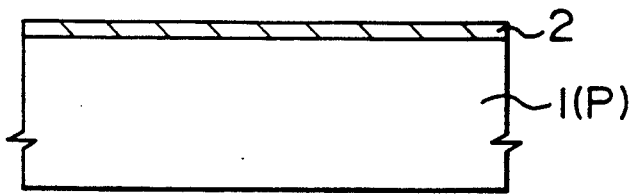
FIGS. 1a to 1j are sectional views showing the respective steps in the process of fabricating the MOS type semiconductor memory device according to one embodiment of the present invention.

Now referring to the drawings, one embodiment of the present invention will be explained. FIGS. 1a to 1j are sectional views showing the respective steps in the process of fabricating the MOS type semiconductor device according to the present invention.

FIG. 1a shows one of plural regions in a P type Si substrate 1 isolated one from another by a field oxide film (not shown) such as a silicon dioxide ($SiO_2$) film formed on its main surface. The Si substrate may be of an N type conductivity in place of the P type.

After the process of isolation, a gate insulating film 2 of an insulating material such as an $SiO_2$ film is formed, about 20–30 nm thick by thermal oxidation on the main surface of an active region encircled by the field oxide film.

Figure 1B:
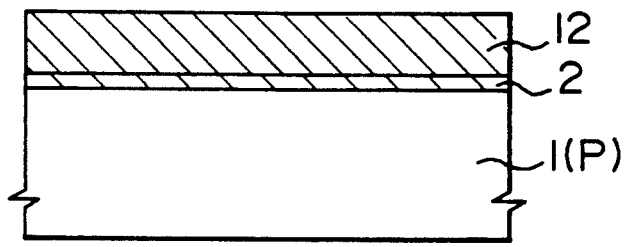
Figure 1C:
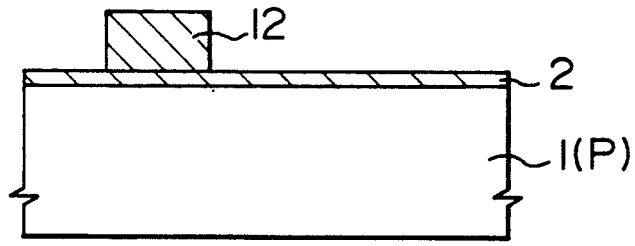

Next, as shown in FIG. 1b, a polycrystalline (poly) Si film 12 is formed, about 150–500 nm thick, on the entire surface by CVD techniques. This poly Si film 12 is doped with impurities such as P, As and P at a concentration of $10^{15}$–$10^{21}$/cm$^3$ by ion-implantation and thermal oxidation to obtain a low resistance. Thereafter, as shown in FIG. 1c, the poly Si film is patterned by etching to form a gate electrode 12 of a MOS transistor. Incidentally, the gate electrode 12 may be formed by a polycide film which is a composite film of a poly Si film doped with impurities and a refractory metal silicide film stacked thereon. In this case, the refractory metal silicide film such as a tungsten silicide film is formed by sputtering or CVD techniques on the poly Si film doped with the impurities; thereafter, the refractory metal silicide film and the poly Si film are patterned to form the gate electrode.

Figure 1D:
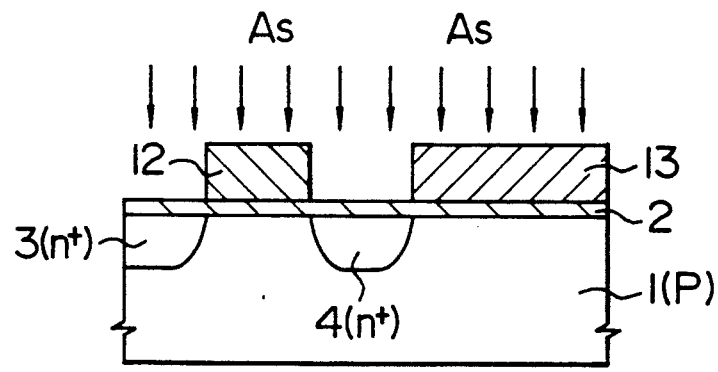

As shown in FIG. 1d, using as a mask the gate oxide film and a resist film formed by e.g. photolithography, the N type impurities such as As are highly ion-implanted in the areas spaced apart from each other in the Si substrate 1 which are to provide source and drain of the MOS type transistor. Thereafter, by carrying out heat treatment for diffusion and electric activation of implanted impurities as required, N+ type source and drain regions 3 and 4 are formed in self-alignment with the gate electrode. The surface concentration of these source region 3 and drain region 4 is e.g. $10^{18}$–$10^{21}$/cm$^3$. The gate electrode 12 and the source and drain regions 3 and 4 between which an N channel is formed constitute an N channel MOS transistor as a transfer gate (access transistor).

Figure 1E:
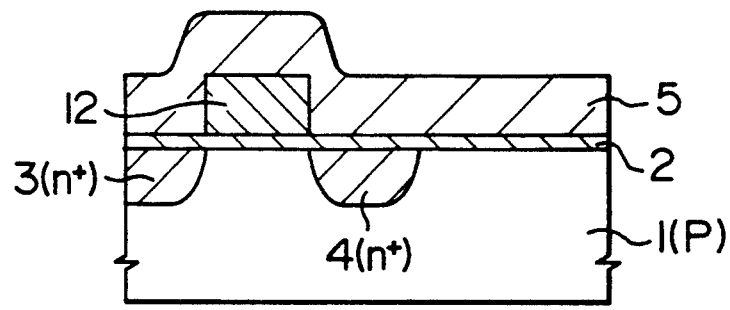

As shown in FIG. 1e, an inter-layer insulating film 5 is formed on the entire surface by e.g. CVD. This inter-layer insulating film 5 may be e.g. an $SiO_2$ film, an phosphorus silicate glass film, boron phosphorus silicate glass or arsenic silicate glass film.

Figure 1F:
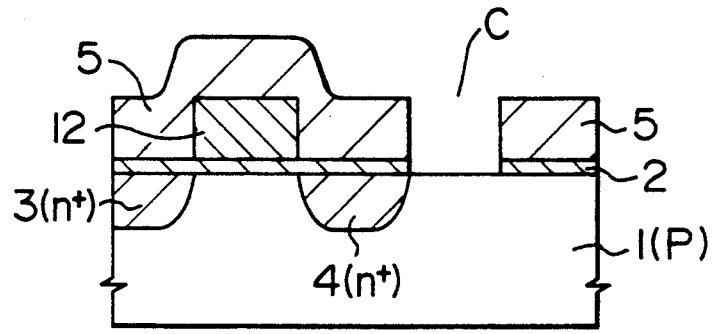
Figure 1G:
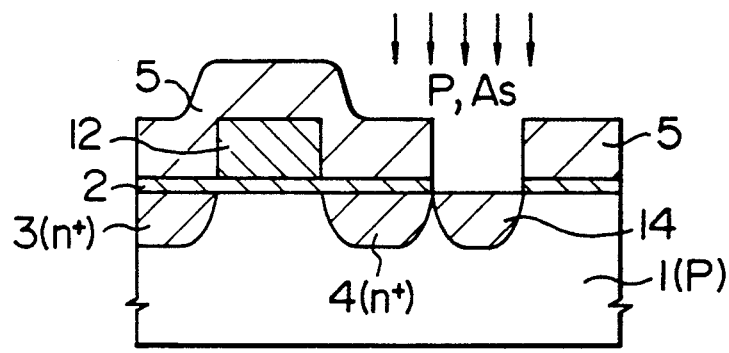

Further, as shown in FIG. 1f, predetermined portions of the inter-layer insulating film 5 and the gate oxide film are etched away to form a contact hole C reaching the part adjacent to the drain region 4 in the Si substrate 1. Subsequently, as shown in FIG. 1g, P and As are successively ion-implanted through the contact hole in the Si substrate 1 thereby to form an ion-implanted layer 14. In this case, the respective dosages of As and P are so selected that the impurity concentration of P is preferably about 1/10–1/100 of at of As. For example, the dosage of As is $10^{14}$–$10^{16}$/cm$^2$ whereas that of P is $10^{12}$–$10^{14}$/cm$^2$. Incidentally, the energy of ion-implantation is 20–60 KeV.

Figure 1H:
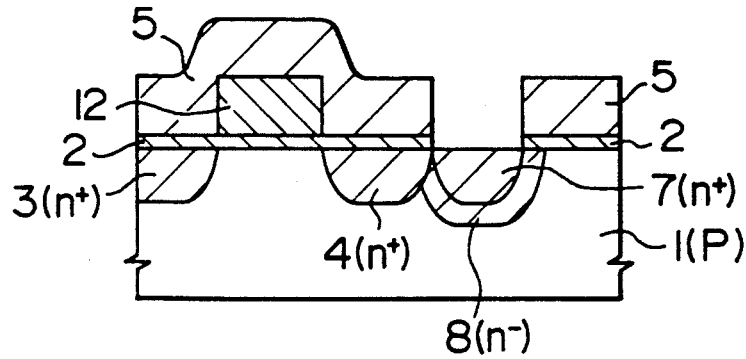

Next, the heat treatment for diffusion and electric activation of implanted As and P are carried out. The heat treatment is carried out at a temperature of 850°–950° C. for a time interval of 30–60 minutes. In this case, it should be noted that since the diffusion coefficient of As is different from that of P such that P diffuses at a higher rate than As, P diffuses deeper than As. Further, since the dosage of P is selected to be lower than that of As, as shown in FIG. 1h, a composite layer of a shallow highly doped N+ type diffused layer 7 and of a deep lightly doped N− type diffused layer 8 is formed. Additionally, the method of making a composite layer of double impurity diffusion is disclosed in e.g. JP-A-63-99573 (1988) and JP-A-2-117176 (1990).

The composite double-diffused layer may be formed by ion-implanting P and thereafter performing heat treatment under the condition as above-mentioned thereby to form the deep and lightly doped diffused layer 8, and successively ion-implanting As and performing the heat treatment under the same condition as above-mentioned thereby to form the shallow and highly doped diffused region 7. Incidentally, the heat treatment for diffusion and electric activation of impurities As and P for forming the double-diffused layer may be also commonly used for the heat treatment for diffusion and electric activation of impurities for forming the source and drain regions 3 and 4.

Next, the oxide film formed on the surface of the Si substrate 1 at the contact hole C in the above heat treatment is etched away as required by using an etching solution of e.g. HF (hydrogen fluoride) series or by anisotropic etching according to RIE (reactive ion etching) techniques.

Figure 1I:
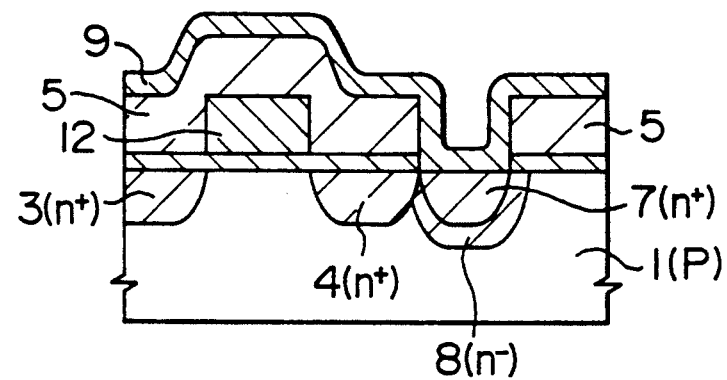

Further, as shown in FIG. 1i, a poly Si film 9 is formed at a thickness of 50–300 nm on the entire surface by e.g. CVD techniques. This poly Si film 9 is used for making a lower electrode of the stacked capacitor through the following process. Subsequently, this poly Si film 9 is ion-implanted with impurities such as P or As under the condition of the dosage of about $10^{14}$/cm$^3$ and the energy of 30–60 KeV. Thereafter, the heat treatment is carried out in $N_2$ atmosphere for 30–60 minutes at a temperature of 800°–950° C. to diffuse the implanted impurities into the entire poly Si film 9. In this case, the impurity concentration in the poly Si film 9 is e.g. $10^{19}$–$10^{21}$/cm$^3$. Incidentally, the impurity doping in the poly Si film may be carried out by thermal oxidation.

Figure 1J:
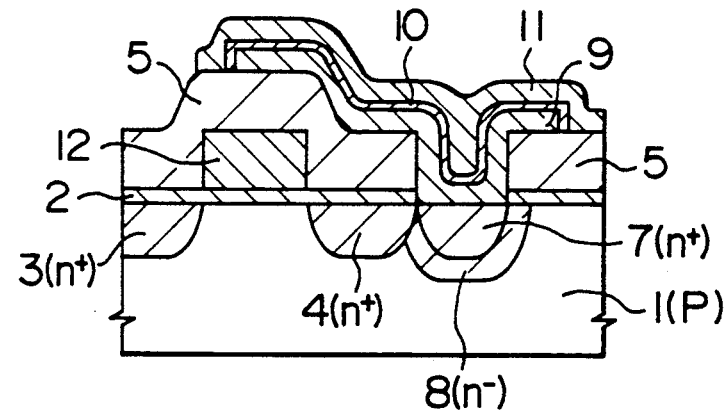

Next, as shown in FIG. 1j, after the oxide film formed on the surface of the poly Si film 9 by the heat treatment is etched away by using the etching solution of e.g. HF, the poly Si film 9 is patterned by etching to form a lower electrode (charge storage layer) 9 of the stacked capacitor cell.

Subsequently, a dielectric layer film 10 is formed on the lower electrode 9. This dielectric film 10 may be a composite film (ONO film) made of three layers including a silicon dioxide ($SiO_2$) film of 0.5–2.0 nm thickness, a silicon nitride ($Si_3N_4$) film of 5.0–10.0 nm thickness and a silicon dioxide ($SiO_2$) film of 0.5–2.0 nm thickness. In this case, the lowest $SiO_2$ film may be an oxide film naturally formed on the surface of the poly Si film constituting the lower electrode 9, or an $SiO_2$ film formed by thermally oxidizing the poly Si film. The $Si_3N_4$ film is formed by e.g. CVD techniques. The uppermost $SiO_2$ film is formed by applying a heat treatment to the $Si_3N_4$ film in a vapor atmosphere e.g. at a temperature of 800°–900° C. for 30–60 minutes.

Next, another poly Si film is formed at a thickness of 100–300 nm thick on the entire surface by CVD techniques. This poly Si film is ion-implanted with impurities such as P or As with the dosage of $10^{14}$–$10^{16}/cm^2$ at the energy of 30–60 KeV, thereafter the poly Si film is subjected to heat treatment at a temperature of 800°–900° C. for 30–60 minutes in $N_2$ gas atmosphere so that the entire poly Si film is diffused with the implanted impurities. In this case, the poly Si film is doped with impurities at a concentration of e.g. $10^{20}$–$10^{21}/cm^3$. Doping the poly Si film with impurities may be also carried out by thermal oxidation. Next, after the oxide film formed on the surface of the poly Si film by the heat treatment is etched away by using an etching solution of e.g. HF, this poly Si film is patterned by etching to form an upper electrode (cell plate) 11 of the stacked capacitor cell. Thus, this upper electrode 11, the dielectric layer 10 and the lower electrode 9 constitute a stacked capacitor cell.

Thereafter, although not explained in detail, by using known techniques, an inter-layer insulating layer is formed, a contact hole is formed, a metallic layer such as an aluminum film having a thickness of 500–1000 nm is formed by sputtering, and a control wire is formed by patterning the metallic film. Further, a passivation film such as an $Si_3N_4$ film is formed by e.g. plasma CVD techniques, thus completing a desired MOS dynamic RAM.

As described above, in accordance with this embodiment of the present invention, the double-diffused layer including the shallow highly doped diffused layer 7 and the deep lightly doped diffused layer 8 is formed at the contact region between the lower electrode of the stacked capacitor cell and the Si substrate 1 so that the deep lightly doped diffused layer 8 of the double-diffused layer is effective to reduce the intensity of electric field at the junction between the double-diffused layer and the Si substrate. Thus, the leak current flowing between the double-diffused layer and the Si substrate is reduced. As a result, the data is held in the memory cell for a sufficiently long time so that when reading the data, the charged state and the discharged state can be correctly discriminated from each other, thus preventing error in reading the data.

Figure 2:
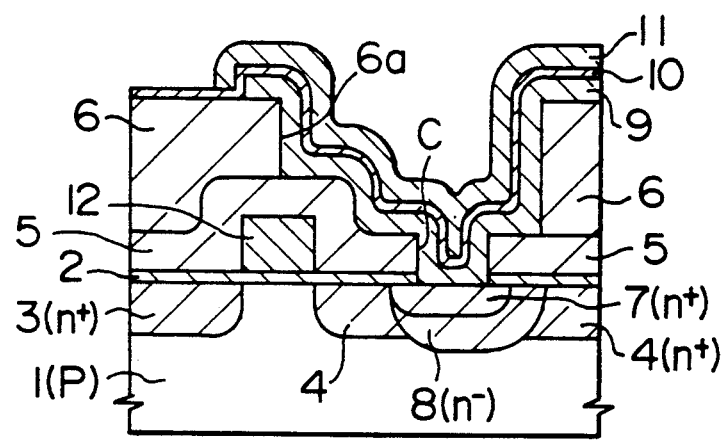
FIG. 2 is a sectional view of the MOS type semiconductor memory device according to another embodiment of the present invention.

Now referring to FIG. 2, an embodiment for further increasing the capacitance of the stacked capacitor will be explained. FIG. 2 shows a MOS dynamic RAM according to another embodiment of the present invention. The fabricating process up to forming the double-diffused layer is the same as in the previous embodiment.

It should be noted that in this embodiment, a second inter-layer insulating film 6 having a flat surface is formed on the first inter-layer insulating film 5 as shown in FIG. 2. This second inter-layer insulating film 6 is made of a material which can be etched selectively with respect to the first inter-layer insulating film 5 and reflowed. Actually, the second inter-layer insulating film 6 may be a silicon dioxide ($SiO_2$) film having a thickness of 100–500 nm and being doped with phosphorus (P) or boron (B) such as phosphorus silicate glass film, boron silicate glass film, boron-phosphorus silicate glass, or composite film or these films. In this case, the P concentration of the P-doped $SiO_2$ may be e.g. 5 to 16 weight % in the form of $P_2O_6$, and the B concentration of the B-doped $SiO_2$ may be e.g. 5 to 15 weight % in the form of $B_2O_3$. The second inter-layer insulating film 6 has an opening or hole 6a which is smaller in size or area than a lower electrode 9 described below and formed at a portion corresponding to the lower electrode.

The lower electrode (charge storage layer) 9 of a stacked capacitor may be made of a poly Si film having a thickness of e.g. 50 to 300 nm and doped with impurities such as P or As at an impurity concentration of $10^{19}$ to $10^{21}/cm^3$. The lower electrode 9 is connected with the drain region 4 of an access transistor through the contact hole C formed in the gate oxide film 2 and the first inter-layer insulating film 5. The lower electrode 9 is formed to cover the surface of the first inter-layer insulating film 5 exposed to the opening or hole 6a of the second inter-layer insulating film 6, the side wall of the opening 6a and the flat surface portion of the second inter-layer insulating film 6 at the periphery of the opening 6a, and to be in contact at its end portion with the second inter-layer 6.

A dielectric layer film 10 is formed on the lower electrode 9 of the stacked capacitor. This dielectric film 10 may be a composite film (ONO film) of three layers of a silicon dioxide ($SiO_2$) film having a thickness of 0.5–2.0 nm, a silicon nitride ($Si_3N_4$) film having a thickness of 5.0–10.0 nm and a silicon dioxide ($SiO_2$) film having a thickness of 0.5–2.0 nm. Further, an upper electrode (cell plate) 11 of the stacked capacitor is formed on the dielectric film 10. The upper electrode 11 may be made of a poly Si film which has a thickness of e.g. 100 to 300 nm and is doped with impurities such as P or As at an impurity concentration of $10^{20}$ to $10^{21}/cm^3$. Thus, the upper electrode 11, the dielectric layer 10 and the lower electrode 9 constitute the stacked capacitor.

As understood from the explanation, in accordance with this embodiment, the end of the lower electrode 9 of the stacked capacitor is extended onto the flat surface of the second inter-layer insulating film 6 so that the etching by the RIE techniques for forming the lower electrode can be carried out with no etching remainder and therefore the lower electrodes 9 of adjacent stacked capacitors can be prevented from being short-circuited. Also, any additional isotropic etching is not required after the anisotropic etching by the RIE techniques so that it is possible to prevent decreasing of the area of the lower electrode 9 which may occur due to side etching by the isotropic etching. Further, the total area of the lower electrode 9 is made larger than that in the first embodiment by an area corresponding to that of the side wall of the opening 6a of the second inter-layer insulating film 6 so that the amount of charge storage of the stacked capacitor can be increased. Therefore, a MOS dynamic RAM which is difficult to generate any software error and has high reliability can be realized.

I claim:

1. A MOS type semiconductor memory device comprising:

a silicon (Si) substrate of a first conductivity type; and
a memory cell formed on a main surface of the Si substrate, the memory cell comprising:
a MOS transistor including first and second high concentration diffused layers highly doped with impurities of a second conductivity type different from the first conductivity type and formed in predetermined regions apart from each other in the main surface of the Si substrate so as to provide source and drain of the MOS transistor, and a gate electrode of a conductive material formed on a channel between the first and second high concentration diffused layers with an insulation layer of an insulating material interposed therebetween;

an inter-layer insulating film of an insulating material formed so as to cover the MOS transistor;

a capacitor cell formed on the inter-layer insulating film and including a lower electrode layer of a conductive material formed on the inter-layer insulating film and having a portion extending through a contact hole formed in the inter-layer insulating film to a junction portion in the Si substrate adjacent to one of the first and second high-concentration diffused layers, a dielectric film formed on the lower electrode layer and an upper electrode layer formed on the dielectric film; and a double-diffused layer doped with impurities of the second conductivity type and formed so as to overlap with one of the first and second high-concentration diffused layers at the junction in the Si substrate so that an electric contact is made between a source-drain circuit of the MOS transistor and the lower electrode, wherein said double-diffused layer comprises a shallow highly doped diffused layer doped with impurities of the second conductivity type and a deep lightly doped diffused layer doped with impurities of the second conductivity type; and wherein said first conductivity type is a P type, and said double-diffused layer includes a high concentration diffused layer highly and shallowly doped with As and a low concentration diffused layer lightly and deeply doped with P.

2. A semiconductor device comprising:

a semiconductor substrate of a first conductivity type;

an insulating layer formed on said semiconductor substrate and having a hole reaching said semiconductor substrate;

a first impurity-doped region formed at the position opposite to said hole in said semiconductor substrate, said first impurity-doped region containing impurities required to exhibit a second conductivity type different from said first conductivity type of said semiconductor substrate; and a second impurity-doped region which is successive to said first impurity-doped region and formed in said semiconductor substrate at a position further away from said hole than said first impurity-doped region and to at least partly surround said first impurity-doped region, said second impurity-doped region having the same conductivity type as said first impurity-doped region and being doped with the impurities required to exhibit the same conductivity type as said first impurity-doped region but at a lower concentration; and wherein said first impurity-doped region is mainly doped with As and said second impurity-doped region is mainly doped with P.

3. A semiconductor device according to claim 2, further comprising an electrode electrically connected with said first impurity-doped region at the hole of said insulating layer.

4. A semiconductor device according to claim 3, further comprising charge storage means for storing charges being in contact with first impurity-doped region through said electrode.

5. A semiconductor device according to claim 4, further comprising switching means for switching storage and erasure of charges in said charge storage means being in contact with sid charge storage means through said second impurity-doped region and said first impurity-doped region.

6. A semiconductor device according to claim 5, wherein said switching means comprises a field-effect transistor.

7. A semiconductor device comprising:

a semiconductor substrate of a first conductivity type;

an insulating layer formed on said semiconductor substrate and having a hole reaching said semiconductor substrate at a predetermined position;

a first impurity-doped region formed at the position opposite to said hole in said semiconductor substrate, said first impurity-doped region containing impurities required to exhibit a second conductivity type different from said first conductivity type of said semiconductor substrate;

a second impurity-doped region which is successive to said first impurity-doped region and formed in said semiconductor substrate at a position being further away from said hole than said first impurity-doped region, and to at least partly surround said first impurity-doped region said second impurity-doped region having the same conductivity type as said first impurity-doped region and doped with the impurities required to exhibit the same conductivity type as said first impurity-doped region but at a lower concentration;

an electrode formed in the hole of said insulating layer and connected with said first impurity-doped region;

charge storage means for storing charges being in contact with said first impurity-doped region through said electrode;

switching means for switching storage and erasure of charges in said charge storage means, being in contact with said charge storage means through said second impurity-doped region, and said first impurity-doped region; and wherein said first impurity-doped region is mainly doped with As and said second impurity-doped region is mainly doped with P.

8. A semiconductor device according to claim 7, wherein said switching means comprises a field-effect transistor.

9. A MOS type semiconductor memory device comprising:

a silicon (Si) substrate of a first conductivity type; and a memory cell formed on a main surface of the Si substrate, the memory cell comprising:

a MOS transistor including first and second high concentration diffused layers highly doped with impurities of a second conductivity type different from the first conductivity type and formed in predetermined regions apart from each other in the main surface of the Si substrate so as to provide source and drain of the MOS transistor, and a gate electrode of a conductive material formed on a channel between the first and second high concentration diffused layers with an insulating layer of an insulating material interposed therebetween;

an inter-layer insulating film of an insulating material formed so as to cover the MOS transistor;

a capacitor cell formed on the inter-layer insulating film and including a lower electrode layer of a conductive material formed on the inter-layer insulating film and having a portion extending through a contact hole formed in the inter-layer insulating film to a junction portion in the Si substrate adjacent to one of the first and second high-concentration diffused layers, a dielectric film formed on the lower electrode layer and an upper electrode layer formed on the dielectric film;

a double-diffused layer doped with impurities of the second conductivity type and formed so as to overlap with one of the first and second high-concentration diffused layers at the junction in the Si substrate so that an electric contact is made between a source-drain circuit of the MOS transistor and the lower electrode, wherein said double-diffused layer comprises a shallow highly doped diffused layer doped with impurities of the second conductivity type and a deep lightly doped diffused layer doped with impurities of the second conductivity type; and wherein said shallow highly doped diffused layer is substantially surrounded by said deep lightly doped diffused layer in said Si substrate.

10. A MOS type semiconductor memory device according to claim 9, wherein said first and second conductivity types are a P type and an N type, respectively.

11. A MOS type semiconductor memory device according to claim 9, wherein said gate electrode is made of a composite film of a poly Si film doped with impurities of the second conductivity type and a refractory metal silicide film stacked thereon.

* * * * *